(12) United States Patent
Yu (10) Patent No.: US 12,260,036 B2
(45) Date of Patent: Mar. 25, 2025

(54) DISPLAY PANEL

(71) Applicant: Wuhan China Star Optoelectronics Semiconductor Display Technology Co., Ltd., Hubei (CN)

(72) Inventor: Shengrong Yu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 18/373,325

(22) Filed: Sep. 27, 2023

(65) Prior Publication Data
US 2024/0256059 A1 Aug. 1, 2024

(30) Foreign Application Priority Data

Jan. 31, 2023 (CN) .......................... 202310098834.X (51) Int. Cl.
| | |
|---|---|
| *G06F 3/041* | (2006.01) |
| *G06F 3/044* | (2006.01) |
| *G06V 40/13* | (2022.01) |
| *H10K 59/126* | (2023.01) |
| *H10K 59/40* | (2023.01) |

(52) U.S. Cl.
CPC .......... *G06F 3/0412* (2013.01); *G06F 3/0445* (2019.05); *G06V 40/1318* (2022.01); *H10K 59/126* (2023.02); *H10K 59/40* (2023.02); *G06F 2203/04111* (2013.01); *G06F 2203/04112* (2013.01)

(58) Field of Classification Search
CPC ................. G06F 3/0412; G06F 3/0445; G06F 2203/04111; G06F 2203/04112; G06V 40/1318; H10K 59/126; H10K 59/40
See application file for complete search history.

(56) References Cited

U.S. PATENT DOCUMENTS

| | | | | |
|---|---|---|---|---|
| 2012/0273804 | A1* | 11/2012 | Hatano | H10K 59/126 257/E33.001 |
| 2018/0269362 | A1* | 9/2018 | Lee | G09G 3/3413 |
| 2019/0197282 | A1* | 6/2019 | Gong | G06V 40/1329 |
| 2020/0184178 | A1* | 6/2020 | Zhou | H10K 59/65 |
| 2023/0165120 | A1* | 5/2023 | Li | H10K 59/8792 257/91 |

\* cited by examiner

*Primary Examiner* — Patrick N Edouard
*Assistant Examiner* — Joseph P Fox (57) ABSTRACT

The present application provides a display panel including a substrate, an array layer, a first light-blocking layer including a first opening and a second opening, a light-emitting device layer, a second light-blocking layer including a third opening provided corresponding to the first opening and a fourth opening provided corresponding to the second opening, a touch control metal layer including a fifth opening disposed corresponding to the first opening and a sixth opening disposed corresponding to the second opening. An area of the fourth opening is lesser than that of the second opening. An area of the sixth opening is greater than or equal to that of the fourth opening.

20 Claims, 6 Drawing Sheets

DISPLAY PANEL

CROSS-REFERENCE TO RELATED APPLICATIONS

This application claims the benefit of priority of Chinese Patent Application No. 202310098834.X, filed on Jan. 31, 2023, the contents of which are incorporated by reference as if fully set forth herein in their entirety.

TECHNICAL FIELD

The present application relates to a display field, and more particularly, to a display panel.

BACKGROUND

Recently, optical fingerprint recognition technology has received increasing attention. However, there is a problem of higher optical signal-to-noise ratio in the optical fingerprint recognition technology.

Therefore, it is necessary to solve the problem of higher signal-to-noise ratio during the optical fingerprint recognition.

SUMMARY

The present application is intended to provide a display panel to reduce the optical signal-to-noise ratio in the optical fingerprint recognition.

According to a first aspect, the present application provides a display panel including: a substrate; an array layer disposed on a side of the substrate, the array layer including a plurality of drive circuit units and a photosensitive unit disposed between adjacent ones of the drive circuit units; a first light-blocking layer disposed on a side of the array layer away from the substrate, the first light-blocking layer including a first opening and a second opening disposed corresponding to the photosensitive unit; a light-emitting device layer disposed on a side of the first light-blocking layer away from the substrate, the light-emitting device layer including a light-emitting unit provided corresponding to the first opening, and the drive circuit unit is electrically connected to the light-emitting unit; a second light-blocking layer disposed on a side of the light-emitting device layer away from the substrate, the second light-blocking layer including a third opening provided corresponding to the first opening and a fourth opening provided corresponding to the second opening, and an area of the fourth opening is lesser than that of the second opening; a touch control metal layer disposed on a side of the second light-blocking layer away from the substrate, the touch control metal layer including a fifth opening disposed corresponding to the first opening and a sixth opening disposed corresponding to the second opening, and an area of the sixth opening is greater than or equal to that of the fourth opening.

According to a second aspect, the present application further provides a display panel including: a substrate; an array layer disposed on a side of the substrate, the array layer including a plurality of drive circuit units and a photosensitive unit disposed between adjacent ones of the drive circuit units; a first light-blocking layer disposed on a side of the array layer away from the substrate, the first light-blocking layer including a first opening and a second opening disposed corresponding to the photosensitive unit; a light-emitting device layer disposed on a side of the first light-blocking layer away from the substrate, the light-emitting device layer including a light-emitting unit provided corresponding to the first opening, and the drive circuit unit electrically connected to the light-emitting unit; a second light-blocking layer disposed on a side of the light-emitting device layer away from the substrate, the second light-blocking layer including a third opening provided corresponding to the first opening and a fourth opening provided corresponding to the second opening, and an area of the fourth opening lesser than that of the second opening; a touch control metal layer disposed between the second light-blocking layer and the light-emitting device layer, the touch control metal layer including a fifth opening disposed corresponding to the first opening and a sixth opening disposed corresponding to the second opening. An area of the sixth opening is greater than or equal to that of the fourth opening.

DETAILED DESCRIPTION

Technical solutions in embodiments of the present application will be clearly and completely described below in conjunction with the accompanying drawings in presented embodiments of the present application. Apparently, the embodiments described below are only portion of, not all of, the embodiments of the present application. Based on the embodiments in the present application, all other embodiments obtained by those of ordinary skill in the art without creative efforts fall within the scope of the present application.

Figure 1:
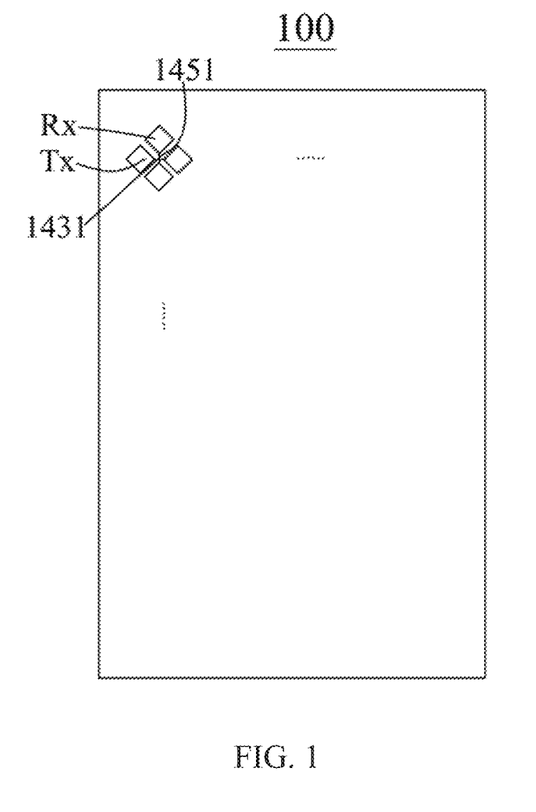
FIG. 1 is a schematic plan view of a display panel according to an embodiment of the present application.
Figure 2:
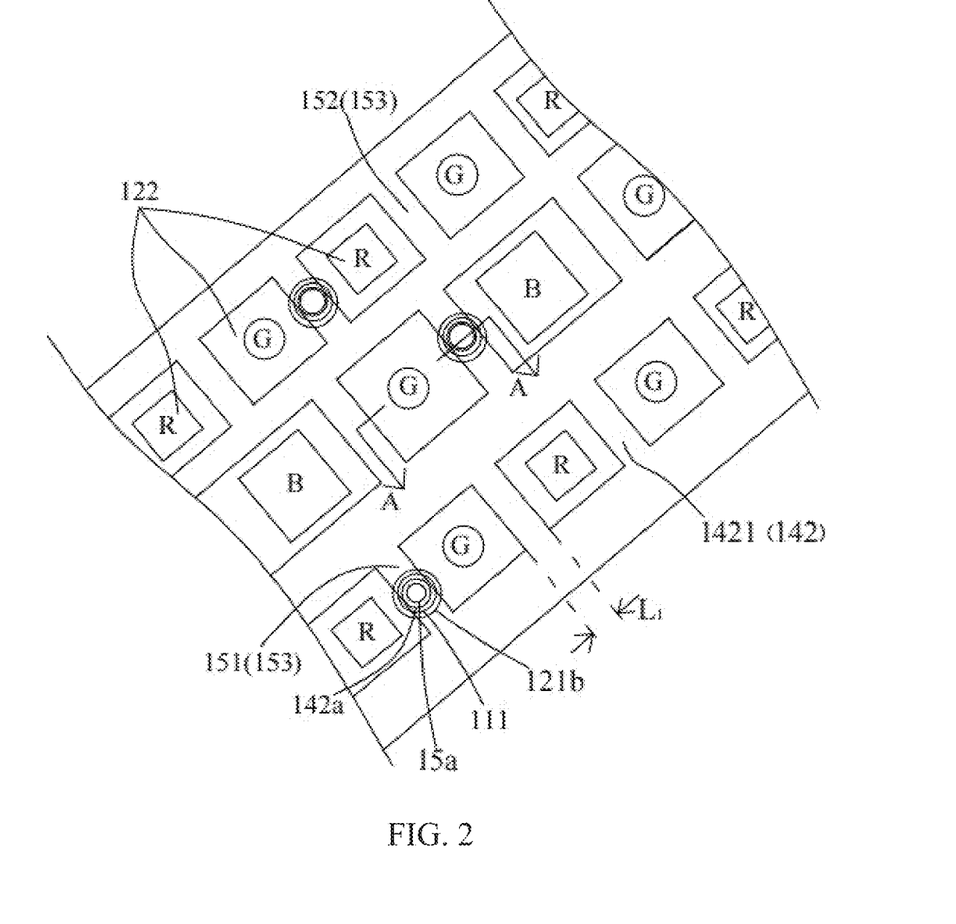
FIG. 2 is a partially enlarged schematic view of the display panel in FIG. 1.
Figure 3:
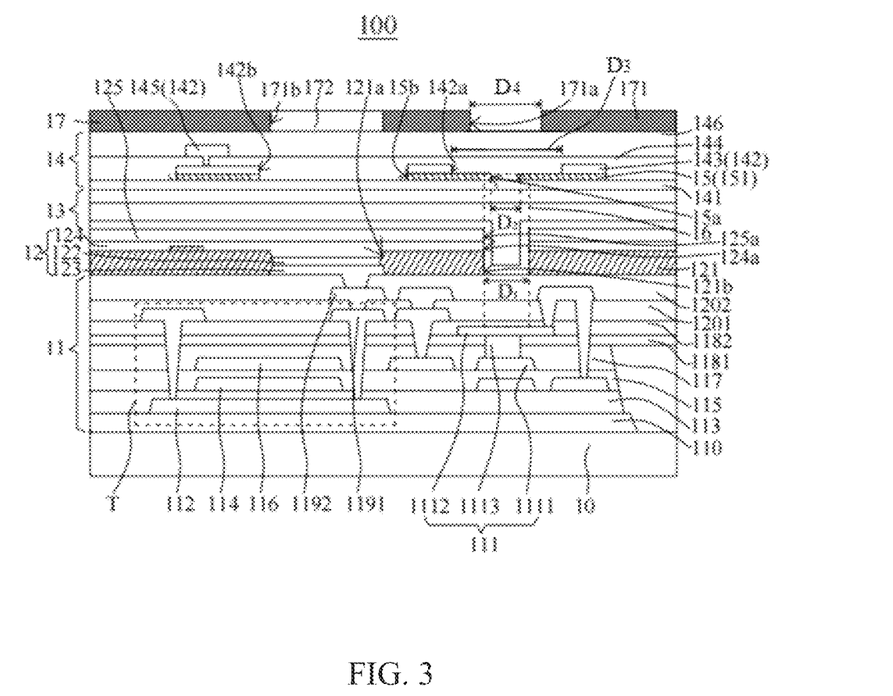
FIG. 3 is a schematic cross-sectional view of the display panel taken along the line A-A of FIG. 2.

Referring to FIGS. 1, 2 and 3, FIG. 1 is a schematic plan view of a display panel according to an embodiment of the present application, FIG. 2 is a partially enlarged schematic view of the display panel in FIG. 1, and FIG. 3 is a schematic cross-sectional view of the display panel taken along the line A-A of FIG. 2.

In an embodiment, the display panel 100 includes a substrate 10, an array layer 11, a first light-blocking layer 121, a light-emitting device layer 12, a thin-film encapsulation layer 13, a touch control layer 14, a second light-blocking layer 15, and a collimated light-transmitting structure 16.

In an embodiment, the substrate 10 includes a glass substrate, but is not limited thereto, and the substrate 10 may include a flexible substrate.

In an embodiment, the array layer 11 is disposed on the substrate 10. The array layer 11 includes a plurality of drive circuit units T and a plurality of photosensitive units 111 disposed between adjacent drive circuit units T. The plurality of photosensitive units 111 include a fingerprint recognition sensor configured to receive light reflected by the fingerprint and converting the light reflected by the fingerprint into a current signal. However, the plurality of photosensitive units 111 are not limited herein, and may further include a photosensitive element such as a camera.

In an embodiment, the photosensitive unit 111 includes a first electrode 1111, a second electrode 1112, and a semiconductor layer 1113 disposed between the first electrode 1111 and the second electrode 1112. The second electrode 1112 is located on a side of the semiconductor layer 1113 away from the substrate 10. The first electrode 1111 is located on a side of the semiconductor layer 1113 close to the substrate 10.

The first electrode 1111 may be an opaque electrode, and the first electrode 1111 includes a metal including, but not limited to, at least one of molybdenum, aluminum, titanium, copper, and silver. The second electrode 1112 may be a transparent electrode, and the second electrode 1112 includes a transparent conductive material including, but not limited to, indium tin oxide and indium zinc oxide. The semiconductor layer 1113 include, but are not limited to, amorphous silicon.

In an embodiment, the first light-blocking layer 121 is provided on a side of the array layer 11 away from the substrate 10, and includes a first opening 121a and a second opening 121b provided corresponding to the photosensitive unit 111. That is, the second opening 121b overlaps the photosensitive unit 111. Each of the second opening 121b and the first opening 121a penetrates through the first light-blocking layer 121 in a thickness direction of the first light-blocking layer 121. The second opening 121b is located between two adjacent first openings 121a.

It should be noted that the first light-blocking layer 121 is a pixel definition layer. The first opening 121a of the first light-blocking layer 121 is configured to define a light-emitting region of the display panel 100. The second opening 121b of the first light-blocking layer 121 is configured, so that light passes through the first light-blocking layer 121 to the photosensitive unit 111. The first light-blocking layer 121 is further used to absorb ambient light.

In an embodiment, the first light-blocking layer 121 is black, so that the first light-blocking layer 121 has a light absorbing property. The thickness of the first light-blocking layer 121 is greater than or equal to 0.8 microns and less than or equal to 3 microns. The first light-blocking layer 121 includes an organic material and carbon black, and the organic material includes, but not limited to, polyimide and polyacrylate.

In an embodiment, the light-emitting device layer 12 is located on a side of the first light-blocking layer 121 away from the substrate 10, and the array layer 11 is located on a side of the light-emitting device layer 12 opposite to the light-emitting side of the light-emitting device layer 12. Specifically, the light-emitting device layer 12 is located on a surface of the array layer 11 away from the substrate 10.

In an embodiment, the light-emitting device layer 12 includes a light-emitting unit 122, an anode 123, and a common cathode 124.

In an embodiment, a plurality of anodes 123 spaced apart from each other are provided on a surface of the array layer 11 away from the substrate 10. The anode 123 is a reflective electrode. The first light-blocking layer 121 is provided on a surface of the array layer 11 away from the substrate 10 and covers edges of the plurality of anodes 123, and each of the first openings 121a exposes a portion of a corresponding one of the anodes 123.

In an embodiment, the light-emitting unit 122 is provided corresponding to the first opening 121a. The light-emitting unit 122 is provided on the anode 123 and is located in the first opening 121a. The drive circuit unit Tis electrically connected to the light-emitting unit 122. The plurality of light-emitting units 122 includes a red light-emitting unit R, a green light-emitting unit G, and a blue light-emitting unit B, as shown in FIG. 2. The light-emitting unit 122 is an organic light-emitting layer. Each light-emitting unit 122 may emit one of red light, blue light, or green light.

It should be noted that, in the present application, the light emitted by the light-emitting unit 122 is not only used for display, but also used as a light source for the photosensitive unit 111. That is, the light emitted by the light-emitting unit 122 is emitted from the display panel 100 and reflected by at least one of a peak or a valley on a finger. The reflected light is received by the photosensitive unit 111 and converted into a current signal. The circuit signal is finally converted into a fingerprint image.

In an embodiment, as shown in FIG. 2, at least one photosensitive unit 111 is located between two adjacent light-emitting units 122. That is, an orthographic projection of the at least one photosensitive unit 111 on the substrate 10 is located between orthographic projections of the two adjacent light-emitting units 122 on the substrate 10, so that the photosensitive unit 111 is disposed in the display area of the display panel 100.

In an embodiment, the common cathode 124 covers the light-emitting unit 122 and the first light-blocking layer 121. The common cathode 124 includes a metallic material.

In an embodiment, the light-emitting device layer 12 further includes a cover layer 125 that covers the common cathode 124 to increase the light output rate of light emitted by the light-emitting unit 122. The cover layer 125 includes at least one of magnesium or indium.

In an embodiment, the thin film encapsulation layer 13 is located on a surface of the light-emitting device layer 12 away from the substrate 10. The thin film encapsulation layer 13 includes a first inorganic insulation layer, an organic insulation layer, and a second inorganic insulation layer stacked in sequence.

In an embodiment, a second light-blocking layer 15 is provided on a side of the light-emitting device layer 12 away from the substrate 10. The second light-blocking layer 15 includes a third opening 15b provided corresponding to the first opening 121a and a fourth opening 15a corresponding to the second opening 121b. Each of the third opening 15b and the fourth opening 15a penetrates through the second light-blocking layer 15 in a thickness direction of the second light-blocking layer 15. The first opening 121a of the second light-blocking layer 15 is configured, so that light emitted from the light-emitting device layer 12 may exit the display panel 100. The third opening 15b of the second light-blocking layer 15 is configured, so that the light reflected by the finger passes through the second light-blocking layer 15 to the photosensitive unit 111.

In an embodiment, the area of the fourth opening 15a is lesser than the area of the second opening 121b. The area of the fourth opening 15a is lesser, so that the accuracy of recognition of the light sensing unit 111 on the light reflected by the fingerprint valley after being emitted by the light-emitting unit 122 and passing through the single fourth opening 15a is improved, and the risk of cross-talk between light reflected by different fingerprint valleys is reduced.

In an embodiment, the second light-blocking layer 15 is black, so that the second light-blocking layer 15 has a light-absorbing property. The second light-blocking layer 15 includes at least one of a black conductive metal or a black metal oxide, so that the accuracy of a pattern of the second light-blocking layer 15 is better than that of the black matrix.

Among them, the black conductive metal includes but is not limited to at least one of a copper chromium alloy, a copper manganese alloy, or an iron alloy. The black metal oxide includes but is not limited to at least one of molybdenum oxide ($MoO_x$), praseodymium oxide, or manganese oxide. Specifically, the second light-blocking layer includes molybdenum oxide ($MoO_x$).

In an embodiment, the touch control layer 14 is located on a side of the light-emitting device layer 12 away from the array layer 11. The touch control layer 14 includes a touch control metal layer 142. The touch control metal layer 142 is disposed on a side of the second light-blocking layer 15 away from the substrate 10. The touch control metal layer 142 includes a fifth opening 142b provided corresponding to the first opening 121a, and a sixth opening 142a corresponding to the second opening. Each of the fifth opening 142b and the sixth opening 142a penetrates through the touch control metal layer 142 in a thickness direction of the touch control metal layer 142. The fifth opening 142b of the touch control metal layer 142 is configured, so that light emitted from the light-emitting device layer 12 may exits from the display panel 100. The sixth opening 142a of the touch control metal layer 142 is configured, so that the light reflected by the finger passes through the touch control metal layer 142 to the photosensitive unit 111.

In the present embodiment, the area of the sixth opening 142a is larger than or equal to the area of the fourth opening 15a, so as to avoid the touch control metal layer 142 from blocking the light reflected by the finger.

Therefore, the first light-blocking layer includes a second opening, the second light-blocking layer includes a fourth opening corresponding to the second opening, the touch-control metal layer includes a sixth opening corresponding to the second opening, the touch-control metal layer is disposed on a side of the second light-blocking layer away from the substrate, so that light emitted from the light-emitting device layer is reflected by a finger, passes through the sixth opening, the fourth opening and the second opening, and then received by the photosensitive unit. The photosensitive unit may realize optical fingerprint identification by using the light. The second light-blocking layer may absorb the visible light emitted by the light-emitting device layer and incident on the touch metal layer. Thus, the optical noise caused by the visible light reflected by the touch metal layer may be reduced. That is, the optical signal-to-noise ratio is reduced. The accuracy of recognition of the photosensitive unit on the optical signal is improved.

Specifically, the touch control layer 14 is located on a surface of the thin film encapsulation layer 13 away from the substrate 10. The touch control layer 14 includes a second light-blocking layer 15 and a touch control metal layer 142. The second light-blocking layer 15 overlaps and contacts the touch control metal layer 142, that is, the second light-blocking layer 15 is disposed in the touch control layer 14 and contacts the touch control metal layer 142.

The second light-blocking layer 15 is located in the touch control layer 14, and the second light-blocking layer 15 overlaps and contacts the touch control metal layer 142, so that the second light-blocking layer 15 may absorb visible light emitted from the light-emitting unit 122 and incident on the touch control metal layer 142, thereby improving reflection of light emitted from the light-emitting unit 122 by the touch control pattern 142, reducing optical noise when the photosensitive unit 111 performs fingerprint recognition, and improving accuracy of fingerprint recognition of the photosensitive unit 111. In addition, the second light-blocking layer 15 may be located in the touch control layer 14, so that the thickness of the display panel 100 is reduced.

In an embodiment, the touch control metal layer 142 includes a first touch control metal layer 143 and a second touch control metal layer 145. The touch control layer 14 further includes a first insulation layer 141, a second insulation layer 144, and a third insulation layer 146. The first insulation layer 141 is disposed on a surface of the thin-film encapsulation layer 13 away from the light-emitting device layer 12. The second light-blocking layer 15 is located on a surface of the first insulation layer 141 away from the thin film encapsulation layer 13. The first touch control metal layer 143 is located on a surface of the second light-blocking layer 15 away from the first insulation layer 141. The second insulation layer 144 covers the first touch control metal layer 143 and the first insulation layer 141. The second touch metal layer 145 is disposed on a surface of the second insulation layer 144 away from the first touch metal layer 143, and the third insulation layer 146 covers the second touch metal layer 145 and the second insulation layer 144.

In an embodiment, both the first insulation layer 141 and the second insulation layer 144 are inorganic insulation layers, and the inorganic insulation layer includes but is not limited to at least one of silicon nitride, silicon oxide, or silicon oxynitride. The third insulation layer 146 is an organic insulation layer, and the organic insulation layer includes, but is not limited to, at least one of polyimide or polyacrylate.

In an embodiment, the thickness of each of the first touch control metal layer 143 and the second touch control metal layer 145 is greater than or equal to 3000 angstroms and less than or equal to 4000 angstroms. Each of the first touch metal layer 143 and the second touch metal layer 145 includes, but is not limited to, at least one of molybdenum, aluminum, titanium, copper, or silver.

In an embodiment, the thickness of the second light-blocking layer 15 is less than or equal to that of the first touch control metal layer 143 and the second touch control metal layer 145. The thickness of the second light-blocking layer 15 is greater than or equal to 3000 angstroms and less than or equal to 4000 angstroms. For example, the thickness of the second light-blocking layer 15 is 3000 angstroms, 3200 angstroms, 3400 angstroms, 3600 angstroms, 3800 angstroms, or 4000 angstroms. It will be appreciated that the thickness of the second light-blocking layer 15 may also be greater than that of the first touch control metal layer 143 and the second touch control metal layer 145.

In an embodiment, one of the first touch control metal layer 143 and the second touch control metal layer 145 includes a driving electrode, a sensing electrode, and a connection portion that connects two adjacent driving electrodes. The other of the first touch control metal layer 143 and the second touch control metal layer 145 includes a bridge line that connects two adjacent sensing electrodes by penetrating through a via in the second insulation layer 144.

In an embodiment, as shown in FIG. 1, the first touch control metal layer 143 includes a driving electrode Tx, a sensing electrode Rx, and a connection portion 1431 that connects two adjacent sensing electrodes Rx. The second touch control metal layer 145 includes a bridge line 1451 that bridges two adjacent driving electrodes Tx by penetrating through a via in the second insulation layer 144.

Alternatively, the second touch control metal layer 145 may include a driving electrode Tx, a sensing electrode Rx, and a connection portion 1431, and the first touch control metal layer 143 includes a bridge line 1451. In addition, one of the first touch control metal layer 143 and the second touch control metal layer 145 may include a plurality of touch control electrodes, and the plurality of touch control electrodes are self-capacitance touch control electrodes. The other of the first touch control metal layer 143 and the second touch control metal layer 145 includes a plurality of touch control wires, and the touch control wires is in one-to-one electrical connection with the touch control electrodes.

In an embodiment, as shown in FIGS. 2 and 3, the touch control metal layer 142 includes a plurality of metal meshes 1421. The metal mesh 1421 has a line width $L_1$ of greater than or equal to 2 μm and less than or equal to 3.5 μm.

Specifically, each of the first touch control metal layer 143 and the second touch control metal layer 145 has a plurality of metal meshes 1421. Each of the metal meshes 1421 of the first touch control metal layer 143 includes a fifth opening 142b provided corresponding to each light-emitting unit 122. Each of the metal meshes 1421 is provided around one light-emitting unit 122 to prevent the metal meshes 1421 from blocking light emitted by the light-emitting unit 122. The first touch control metal layer 143 further includes a sixth opening 142a.

Note that since the touch control metal layer 142 includes a plurality of metal meshes 1421, the metal meshes 1421 reflect light incident thereto. The light emitted by the light-emitting unit 122 is incident on the touch control metal layer 142 and reflected by the touch control metal layer 142. The ambient light incident from a light-emitting side of the display panel 100 is also reflected after being incident on the metal mesh 1421. The reflected ambient light and the light emitted by the light-emitting unit 122 and reflected by the metal mesh 1421 are optical noises, which reduce the fingerprint recognition accuracy of the photosensitive unit 111.

It should also be noted that the first touch control metal layer 143 includes a driving electrode, a sensing electrode, and a connection portion, so that a ratio of an area of the metal the first touch control metal layer 143 to the total area of the first touch control metal layer 143 is larger than that of the second touch control metal layer 145. In addition, the first touch control metal layer 143 is closer to the light-emitting unit 122 than the second touch control metal layer 145. The second light-blocking layer 15 is disposed below the first touch control metal layer 143. Thus, the reflection effect of the first touch control metal layer 143 on light emitted by the light-emitting unit 122 may be significantly improved, thereby preventing the reflected portion of the light emitted by the light-emitting unit 122 from interfering with the light reflected by the fingerprint and received by the photosensitive unit 111 to generate noise.

It will be appreciated that in other embodiments, the second light-blocking layer 15 may also be disposed on a surface of the second insulation layer 144 away from the first insulation layer 141, and the second touch control metal layer 145 is disposed on a surface of the second light-blocking layer 15 away from the first insulation layer 141. Alternatively, one portion of the second light-blocking layer 15 is provided on a surface of the first insulation layer 141 away from the thin-film encapsulation layer 13, other portion of the second light-blocking layer 15 is provided on a surface of the second insulation layer 144 away from the first insulation layer 141. The first touch-control metal layer 143 is provided on a surface of the one portion of the second light-blocking layer 15 away from the first insulation layer 141. The second touch-control metal layer 145 is provided on a surface of the other portion of the second light-blocking layer 15 away from the first insulation layer 141. The second touch-control metal layer 145 is connected to the first touch-control metal layer 143 by penetrating through the other portion of the second light-blocking layer 15 and a via in the second insulation layer 144.

In an embodiment, the second light-blocking layer 15 includes a plurality of light-shielding meshes 153. The line width $L_2$ of the light-shielding mesh 153 is equal to the line width $L_1$ of the metal mesh 1421. The line width $L_2$ of the light-shielding mesh 153 is greater than or equal to 2 μm and less than or equal to 3.5 μm.

In an embodiment, the plurality of light-shielding meshes 153 includes a first light-shielding mesh 151 provided with a fourth opening 15a that overlaps the photosensitive unit 111, and a second light-shielding mesh 152 that does not overlap the photosensitive unit 111.

The shape and size of the at least one light-shielding mesh 153 is the same as the shape and size of the at least one metal mesh 1421. Specifically, an orthographic projection of the light-shielding mesh 153 of the second light-shielding mesh 152 on the substrate 10 completely overlaps that of the metal mesh 1421 of the first touch control metal layer 143 on the surface of the second light-shielding mesh 152, and the line width of the second light-shielding mesh 152 is equal to the line width of the metal mesh 1421 on the surface of the second light-shielding mesh 152.

It will be appreciated that the orthographic projection of the second light-shielding mesh 152 on the substrate 10 may also cover that of the metal mesh 1421 of the first touch-control metal layer 143 on the surface of the second light-shielding mesh 152, thereby minimizing the reflection of the metal mesh 1421 on the light emitted by the light-emitting unit 122.

In an embodiment, the collimated light-transmitting structure 16 is configured to enhance the collimating characteristics of light incident in the collimated light-transmitting structure 16. The collimated light-transmitting structure 16 overlaps the photosensitive unit 111, so that the light emitted by the light-emitting unit 122 is reflected by the fingerprint of the finger and is received by the photosensitive unit 111 by passing through the collimated light-transmitting structure 16.

In an embodiment, the collimated light-transmitting structure 16 extends in the thickness direction of the display panel 100. The collimated light-transmitting structure 16 includes a second opening 121b located in the first light-blocking layer 121 and a fourth opening 15a located in the second light-blocking layer 15. The second opening 121b overlaps the fourth opening 15a. The fourth opening 15a is located in the first light-shielding mesh 151. The second opening 121b defines a size of the collimating transparent structure 16 in a direction perpendicular to the thickness of the display panel 100.

In an embodiment, the second opening 121b has a circular cross-sectional shape in a plan perpendicular to the thickness of the display panel 100, but is not limited thereto. The second opening 121b may have a rectangular, elliptical, or other shape in the plan perpendicular to the thickness of the display panel 100. Specifically, the second opening 121b has a circular cross-sectional shape in the plan perpendicular to the thickness of the display panel 100, to simplify the manufacturing process of the second opening 121b.

In an embodiment, the diameter $D_1$ of the second opening 121b is larger than or equal to the size of the semiconductor layer 1113 in the direction perpendicular to the thickness of the display panel 100. The diameter $D_1$ of the second opening 121b is greater than or equal to 5 microns and less than or equal to 10 microns. For example, the diameter $D_1$ of the second opening 121b is 5 microns, 6 microns, 7 microns, 8 microns, 9 microns, or 10 microns.

In an embodiment, the fourth opening 15a has a circular cross-sectional shape in the plan perpendicular to the thickness of the display panel 100, but is not limited thereto. The fourth opening 15a may have a rectangular, elliptical, or other shape in the plan perpendicular to the thickness of the display panel 100. Specifically, the fourth opening 15a has a circular cross-sectional shape in the plan perpendicular to the thickness of the display panel 100, to simplify the manufacturing process of the fourth opening 15a.

In an embodiment, the diameter D2 of the fourth opening 15a is lesser than the diameter $D_1$ of the second opening 121b. The diameter D2 of the fourth opening 15a is lesser, so that the accuracy of recognition of the light sensing unit 111 on the light reflected by the fingerprint valley after being emitted by the light-emitting unit 122 and passing through the single collimated light-transmitting structure 16 is improved, and the risk of cross-talk between light reflected by different fingerprint valleys is reduced.

In an embodiment, the diameter D2 of the fourth opening 15a is greater than or equal to 1.5 microns and less than or equal to 8 microns. For example, the diameter D2 of the fourth opening 15a is 2 microns, 3 microns, 4 microns, 5 microns, 6 microns, 7 microns, or 8 microns. When the diameter D2 of the fourth opening 15a is less than 1.5 microns, the accuracy of the process for forming the light absorption pattern is difficult to meet the requirements of the diameter D2 of the fourth opening 15a. When the diameter D2 of the fourth opening 15a is larger than 8 microns, the fourth opening 15a is excessively larger, and more noise light is incident into the collimated light-transmitting structure 16 so as to interfere with fingerprint recognition.

It will be appreciated that the diameter D2 of the fourth opening 15a may be equal to the diameter $D_1$ of the second opening 121b.

In an embodiment, the diameter D2 of the fourth opening 15a is lesser than the line width of the first light-shielding mesh 151.

In an embodiment, the touch pattern 142 of the first touch control metal layer 143 further includes a sixth opening 142a that overlaps with the collimated light-transmitting structure 16. The diameter D3 of the sixth opening 142a is larger than the diameter D2 of the fourth opening 15a, so that the sidewall of the sixth opening 142a offsets outwards with respect to the sidewall of the fourth opening 15a. A portion of the first light-shielding mesh 151 protruding with respect to the metal mesh 1421 may absorb ambient light and light incident to the metal mesh 1421 emitted by the light-emitting unit 122, thereby reducing noise in fingerprint recognition of the photosensitive unit 111 caused by the ambient light and the light emitted by the light-emitting unit 122.

In an embodiment, the diameter D3 of the sixth opening 142a may be lesser than the line width $L_1$ of the metal mesh 1421, so as to prevent the metal mesh 1421 from being disconnected to affect the touch performance.

It will be appreciated that the diameter D3 of the sixth opening 142a may be larger than the line width $L_1$ of the metal mesh 1421. In this case, the design for the position of the photosensitive unit 111 is selective so as to avoid that the driving electrode Tx, the sensing electrode Rx, and the connection portion 1431 to be disconnected by the sixth opening 142a, thereby affecting the touch performance.

In an embodiment, as shown in FIG. 3, the common cathode 124 further includes a cathode light-transmitting hole 124a penetrating through the common cathode 124. The cover layer 125 further includes a cover layer light-transmitting hole 125a penetrating through the cover layer 125. The cathode light-transmitting hole 124a and the cover layer light-transmitting hole 125a overlap the second opening 121b. The side wall of the cathode light-transmitting hole 124a may be aligned with the side wall of the second opening 121b, and the side wall of the cover layer light-transmitting hole 125a may be aligned with the side wall of the second opening 121b. That is, the diameter of the cathode light-transmitting hole 124a and the diameter of the cover layer light-transmitting hole 125a are both the same as the diameter $D_1$ of the second opening 121b.

In an embodiment, the collimated light-transmitting structure 16 further includes a portion of the thin film encapsulation layer 13 and the first insulation layer 141 overlapping the second opening 121b. The collimated light-transmitting structure 16 further includes a portion of the array layer 11 disposed above the photosensitive unit 111 and overlapping the second opening 121b.

In an embodiment, the light emitted by the light-emitting unit 122 is emitted from the light-emitting surface of the display panel 100, is reflected by the fingerprint of the finger, passes through the third insulation layer 146, the second insulation layer 144, and the sixth opening 142a, and then enters the collimated light-transmitting structure 16. After passing through the collimated light-transmitting structure 16, the light reflected by the fingerprint of the finger is received by the photosensitive unit 111. The photosensitive unit 111 converts the light reflected by the fingerprint of the finger into a current signal, and the current signal is processed and converted into a fingerprint image of the finger.

In addition, since the collimated light-transmitting structure 16 according to an embodiment may be defined by the diameter D2 of the fourth opening 15a and the diameter $D_1$ of the second opening 121b, a lesser portion of the light reflected by the touch control metal layer 142 is incident in the collimated light-transmitting structure 16, thereby reducing the optical signal-to-noise ratio when the photosensitive unit 111 performs fingerprint recognition, and improving the accuracy of fingerprint recognition.

In an embodiment, the display panel 100 may further include a color film layer 17 located on a side of the touch control metal layer 142 away from the substrate 10. Specifically, the color film layer 17 may be located on a surface of the third insulation layer 146 of the touch control layer 14 away from the light-emitting device layer 12.

In an embodiment, the color film layer 17 includes a third light-blocking layer 171 and a color resist unit 172. The third light-blocking layer 171 includes a seventh opening 171b and an eighth opening 171a provided spaced apart from each other. The seventh opening 171b is provided corresponding to the first opening 121a. The eighth opening 171a is provided corresponding to the second opening 121b. Each of the seventh opening 171b and the eighth opening 171a penetrates through the color film layer 17 in a thickness direction of the color film layer 17. The color resist unit 172 is provided corresponding to the seventh opening 171b, and the color resist unit 172 is located in the seventh opening 171b.

Here, the eighth opening 171a overlaps with the collimated light-transmitting structure 16, and the area of the eighth opening 171a is larger than or equal to the area of the second opening 121b, so as to reduce the requirement for the process resolution force of the eighth opening 171a of the third light-blocking layer 171.

Specifically, the diameter $D_4$ of the eighth opening 171a is larger than the diameter $D_1$ of the second opening 121b, so that the area of the eighth opening 171a is larger than or equal to the area of the second opening 121b.

The seventh opening 171b overlaps with the light-emitting unit 122, so that the light energy emitted by the light-emitting unit 122 is emitted from the display panel 100.

Here, the diameter $D_4$ of the eighth opening 171a is greater than 8 μm and less than or equal to 10 μm, so that the diameter $D_4$ of the eighth opening 171a is greater than the diameter $D_1$ of the second opening 121b, to avoid too much ambient light to be incident into the collimated light-transmitting structure 16 from the eighth opening 171a due to the larger diameter $D_4$ of the eighth opening 171a, and to avoid interference to the light reflected by the fingerprint and expected to be received by the photosensitive unit 111, thereby improving noise.

It should be noted that, since the third light-blocking layer 171 includes negative photoresist material, the opening formed in the third light-blocking layer 171 is difficult to have a lesser size, so that the process resolution force thereof is limited. The diameter $D_4$ of the eighth opening 171a is larger than the diameter $D_1$ of the second opening 121b, so that the size of the eighth opening 171a is larger. The eighth opening 171a is easier to form in the manufacturing process, thereby simplifying the process of the display panel.

It should also be noted that, if the eighth opening 171a of the third light-blocking layer 171 is used as the collimation hole of the collimated light-transmitting structure, there is a problem that the third light-blocking layer 171 remains in a process of forming the eighth opening 171a. Therefore, the size of the eighth opening 171a does not meet the size requirement of the collimation hole. However, there is a higher accuracy in a process of forming the fourth opening 15a in the second light-blocking layer 15 according to an embodiment of the present application, and the fourth opening 15a satisfying the above requirement may be obtained without a residue of the prepared material.

In an embodiment, the area of the sixth opening 142a is larger than the area of the eighth opening 171a, so that the eighth opening 171a is lesser and the sixth opening 142a is larger. Therefore, too much ambient light incident into the collimated light-transmitting structure 16 through the eighth opening 171a may be avoided to interfere with the light reflected by the fingerprint and expected to be received by the photosensitive unit 111, thereby improving noise. In addition, reflection of the ambient light by the touch control pattern 142 around the collimated light-transmitting structure 16 may be reduced, to avoid interference to the fingerprint recognition process of the photosensitive unit.

In an embodiment, the array layer 11 includes a buffer layer 110, an active layer 112, a fourth insulation layer 113, a first conductive layer 114, a fifth insulation layer 115, a second conductive layer 116, a sixth insulation layer 117, a seventh insulation layer 1181, an eighth insulation layer 1182, a third conductive layer 1191, a ninth insulation layer 1201, a tenth insulation layer 1202, and a fourth conductive layer 1192.

The buffer layer 110, the fourth insulation layer 113, the fifth insulation layer 115, the sixth insulation layer 117, the seventh insulation layer 1181, and the eighth insulation layer 1182 are all inorganic insulation layers. The inorganic insulation layer include but are not limited to at least one of silicon nitride, silicon oxide, or silicon oxynitride. Both the ninth insulation layer 1201 and the tenth insulation layer 1202 are organic planarization layers. The organic planarization layers include but are not limited to at least one of polyimide or polyacrylate. The first conductive layer 114, the second conductive layer 116, the third conductive layer 1191, and the fourth conductive layer 1192 include, but are not limited to, at least one of molybdenum, aluminum, titanium, copper, or silver.

The buffer layer 110 is provided on the surface of the substrate 10.

The active layer 112 is disposed on a surface of the buffer layer 110 away from the substrate 10. The active layer 112 includes, but is not limited to, at least one of metal oxide, low-temperature polysilicon, or amorphous silicon.

The fourth insulation layer 113 covers the active layer 112 and the buffer layer 110. The fourth insulation layer 113 is a gate insulation layer.

The first conductive layer 114 is located on a surface of the fourth insulation layer 113 away from the substrate 10, and includes a gate electrode, a first conductive pattern, and a second conductive pattern that are spaced apart from each other, and the gate electrode overlaps the active layer 112.

The fifth insulation layer 115 covers the first conductive layer 114 and the fourth insulation layer 113.

The second conductive layer 116 is located on a surface of the fifth insulation layer 115 away from the substrate 10. The second conductive layer 116 includes an electrode plate and a first electrode 1111. The electrode plate overlaps the gate electrode, and the first electrode 1111 overlaps the first conductive pattern.

The sixth insulation layer 117 covers the second conductive layer 116 and the fifth insulation layer 115.

The seventh insulation layer 1181 covers a surface of the sixth insulation layer 117 away from the substrate 10. The semiconductor layer 1113 penetrates through the sixth insulation layer 117 and the seventh insulation layer 1181 and is disposed on the first electrode 1111. The seventh insulation layer 1181 is a passivation layer.

The second electrode 1112 is disposed on the seventh insulation layer 1181 and is in contact with the semiconductor layer 1113.

The eighth insulation layer 1182 covers the second electrode 1112 and the seventh insulation layer 1181. The eighth insulation layer 1182 may be a passivation layer.

The third conductive layer 1191 is provided on a surface of the eighth insulation layer 1182 away from the substrate 10. The third conductive layer 1191 includes a source electrode and a drain electrode. The source electrode is in contact with the active layer 112 through a first via penetrating through the eighth insulation layer 1182, the seventh insulation layer 1181, the sixth insulation layer 117, the fifth insulation layer 115, and the fourth insulation layer 113. The drain electrode is in contact with the active layer 112 through a second via penetrating through the eighth insulation layer 1182, the seventh insulation layer 1181, the sixth insulation layer 117, the fifth insulation layer 115, and the fourth insulation layer 113.

The ninth insulation layer 1201 covers the third conductive layer 1191 and the eighth insulation layer 1182.

The fourth conductive layer 1192 is located on a surface of the ninth insulation layer 1201 away from the substrate 10. The fourth conductive layer 1192 includes a connection electrode and a bridge electrode. The connection electrode is disposed corresponding to the drain electrode, and the connection electrode is connected to the drain electrode through a third via penetrating through the ninth insulation layer 1201. The bridge electrode may be connected to the second electrode 1112 through a fourth via penetrating through the ninth insulation layer 1201 and the eighth insulation layer 1182. The bridge electrode may further be connected to the second conductive pattern through a fifth via penetrating through the ninth insulation layer 1201, the eighth insulation layer 1182, the seventh insulation layer 1181, the sixth insulation layer 117, and the fifth insulation layer 115.

The tenth insulation layer 1202 covers the fourth conductive layer 1192 and the ninth insulation layer 1201. The anode 123 is connected to the connection electrode through a sixth via penetrating through the tenth insulation layer 1202.

The drive circuit unit T includes a thin film transistor including an active layer 112, a gate, a source, and a drain.

Figure 4:
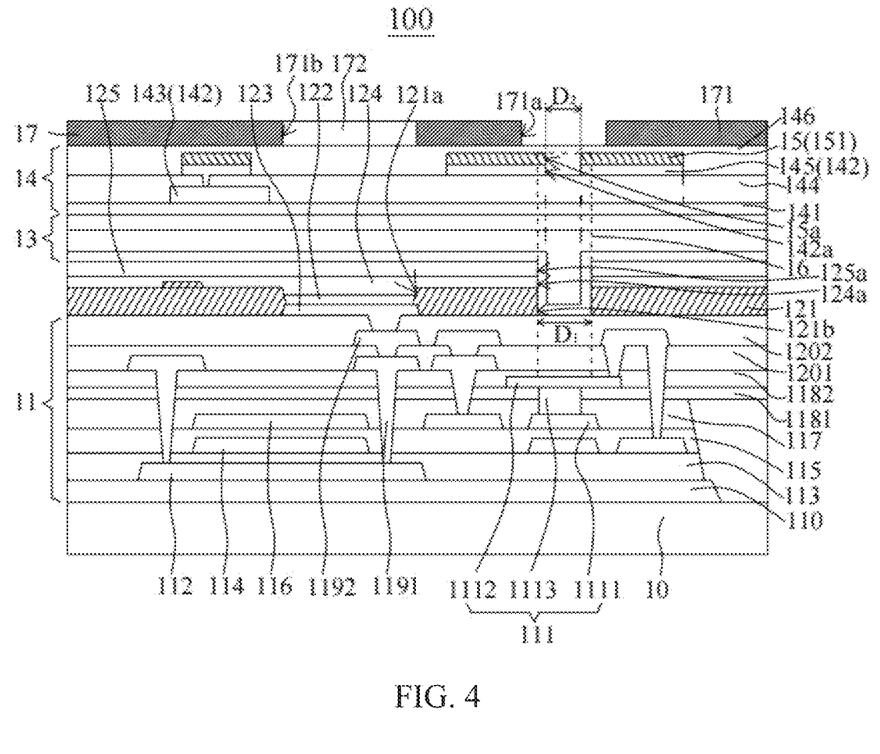
FIG. 4 is a schematic cross-sectional view of a display panel according to another embodiment of the present application.

FIG. 4 is a schematic cross-sectional view of a display panel according to another embodiment of the present application. The display panel shown in FIG. 4 is substantially similar to the display panel shown in FIG. 3, except that the touch control metal layer 142 is located between the second light-blocking layer 15 and the light-emitting device layer 12. The repeated description is not described in detail.

In an embodiment, the display panel shown in FIG. 4 differs from the display panel shown in FIG. 3 in that the second touch control metal layer 145 includes a driving electrode Tx, a sensing electrode Rx, and a connection portion 1431, the connection portion 1431 connects two adjacent sensing electrodes Rx, and the first touch control metal layer 143 includes a bridge connection 1451 that bridges the two adjacent driving electrodes Tx through a via hole penetrating through the second insulation layer 144.

In an embodiment, the second light-blocking layer 15 is located on a surface of the second touch-control metal layer 145 away from the light-emitting device layer 12, to absorb ambient light incident from the eighth opening 171a toward the second touch-control metal layer 145, reduce ambient light reflected by the second touch-control metal layer 145 and incident into the collimated light-transmitting structure 16, and to reduce noise in the light reflected by the fingerprint of the finger transmitted to the photosensitive unit 111 through the collimated light-transmitting structure 16.

In an embodiment, the orthographic projection of the second light-blocking layer 15 on the substrate 10 completely overlaps with the orthographic projection of the touch pattern 142 of the second touch metal layer 145 on the substrate 10, and the light-shielding mesh 153 of the second light-blocking layer 15 and the metal mesh 1421 of the second touch metal layer 145 have the same shape and size.

In the present embodiment, the sixth opening 142a is located in the second touch control metal layer 145, the diameter D2 of the fourth opening 15a is equal to the diameter D3 of the sixth opening 142a of the second touch control metal layer 145, and the sidewall of the fourth opening 15a is aligned with the sidewall of the sixth opening 142a.

In the present embodiment, the collimated light-transmitting structure 16 includes portions of an array layer 11, a thin-film encapsulation layer 13, a first insulation layer 141, and the second insulation layer 144 disposed above the photosensitive unit 111 and overlapping the second opening 121b. The collimated light-transmitting structure 16 is a structure formed by layers from the array layer 11 above the photosensitive unit 111 through the thin-film encapsulation layer 13 to the second light-blocking layer 15 in the touch layer 14.

It will be appreciated that in other embodiments, one portion of the second light-blocking layer 15 may be located on a surface of the second touch control metal layer 145 away from the light-emitting device layer 12, and the first touch control metal layer 143 is located on a surface of other portion of the second light-blocking layer 15 away from the light-emitting device layer 12, and the other portion of the second light-blocking layer 15 is located on the first insulation layer 141. As a result, the one portion of the second light-blocking layer 15 absorbs ambient light incident to the second touch control metal layer 145, and the other portion of the second light-blocking layer 15 absorbs light emitted from the light-emitting unit 122 and incident to the first touch control metal layer 143, thereby minimizing the noise in fingerprint recognition of the photosensitive unit 111 due to the light reflected from the touch control pattern 142.

Therefore, the first light-blocking layer includes a second opening, the second light-blocking layer includes a fourth opening corresponding to the second opening, the touch-control metal layer is disposed between the second light-blocking layer and the light-emitting device layer. The light emitted from the light-emitting device layer is reflected by a finger, passes through the sixth opening, the fourth opening and the second opening, and then received by the photosensitive unit. The second light-blocking layer may absorb the visible light emitted by the light-emitting device layer and incident on the touch metal layer. Thus, the optical noise caused by the visible light reflected by the touch metal layer may be reduced. That is, the optical signal-to-noise ratio is reduced. The accuracy of recognition of the photosensitive unit on the optical signal is improved.

Figure 5:
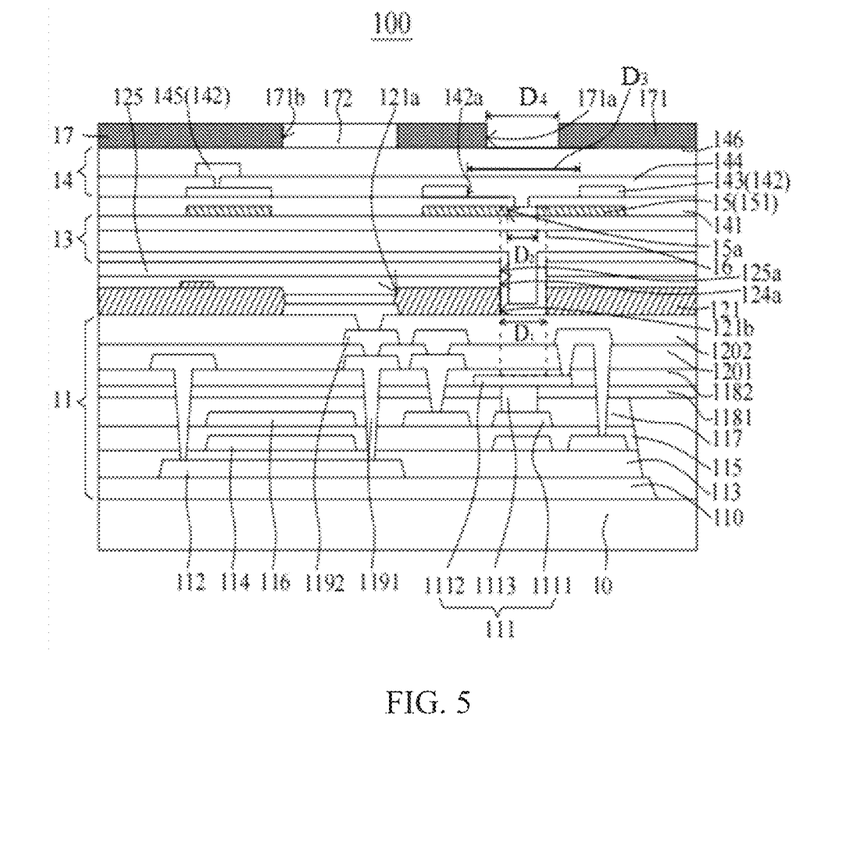
FIG. 5 is a schematic cross-sectional view of a display panel according to yet another embodiment of the present application.

FIG. 5 is a cross-sectional view of a display panel according to yet another embodiment of the present application. The display panel shown in FIG. 5 is substantially similar to the display panel shown in FIG. 3, and is not described in detail, except that an insulation layer is provided between the touch control metal layer 142 and the second light-blocking layer 15.

Specifically, the second light-blocking layer 15 is located on a surface of the thin-film encapsulation layer 13 away from the substrate 10, and the first insulation layer 141 covers the second light-blocking layer 15 and the thin-film encapsulation layer 13.

In the present embodiment, the light-shielding mesh 153 of the second light-blocking layer 15 overlaps the metal mesh 1421 of the first touch control metal layer 143. In addition, the second light-blocking layer 15 in FIG. 5 is same as the second light-blocking layer 15 in FIG. 3, except for its position, and details are not described herein.

Figure 6:
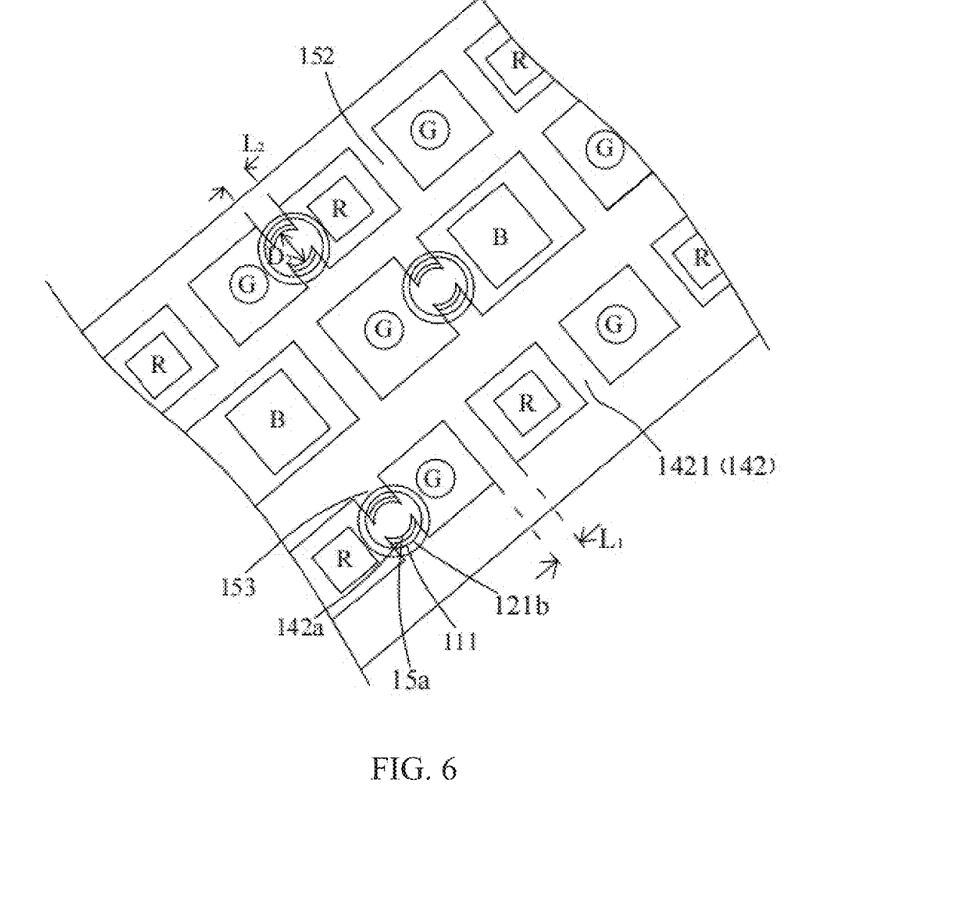
FIG. 6 is a partially enlarged plan view of a display panel according to yet another embodiment of the present application.

FIG. 6 is a partially enlarged plan view of a display panel according to yet another embodiment of the present application. The display panel shown in FIG. 6 is substantially similar to the display panel shown in FIG. 2, except that diameter D2 of the at least one fourth opening 15a is larger than the line width $L_2$ of the light-shielding mesh 153. The repeated description is not described in detail.

In the present embodiment, since the diameter D2 of the fourth opening 15a is larger than the line width $L_2$ of the light-shielding mesh 153, at least one light-shielding mesh 153 is disconnected at the fourth opening 15a. Meanwhile, the diameter $D_1$ of the second opening 121b is larger than the line width $L_1$ of the metal mesh 1421, and the metal mesh 1421 is disconnected at the second opening 121b.

The description of the above embodiments is only used to help understand the technical solutions of the present application and its core ideas; a person of ordinary skill in the art should understand that it is still possible to make modifications to the technical solutions in the foregoing embodiments or to make equivalent substitutions for some of the technical features therein. These modifications or substitutions do not make the essence of the corresponding technical solutions detached from the scope of the technical solutions of the embodiments of the present application.

What is claimed is:

1. A display panel, comprising:
   a substrate;
   an array layer disposed on a side of the substrate, wherein the array layer comprises a plurality of drive circuit units and a photosensitive unit disposed between adjacent ones of the drive circuit units;
   a pixel definition layer disposed on a side of the array layer away from the substrate, wherein the pixel definition layer comprises a first opening and a second opening disposed corresponding to the photosensitive unit and the pixel definition layer has a light absorbing property;
   a light-emitting device layer at least partially disposed on a side of the pixel definition layer away from the substrate, wherein the light-emitting device layer comprises a light-emitting unit provided in the first opening, and the light-emitting unit is electrically connected to a corresponding one of the drive circuit units;
   a second light-blocking layer disposed on a side of the light-emitting device layer away from the substrate, wherein the second light-blocking layer comprises a third opening provided corresponding to the first opening and a fourth opening provided corresponding to the second opening, and an area of the fourth opening is lesser than that of the second opening; and
   a touch control metal layer disposed on a side of the second light-blocking layer away from the substrate, wherein the touch control metal layer comprises a fifth opening disposed corresponding to the first opening and a sixth opening disposed corresponding to the second opening, and an area of the sixth opening is greater than or equal to that of the fourth opening.

2. The display panel according to claim 1, further comprising:
   a color film layer disposed on a side of the touch control metal layer away from the substrate,
   wherein the color film layer comprises: a third light blocking layer and a color resist unit, the third light blocking layer comprises a seventh opening provided corresponding to the first opening and an eighth opening provided corresponding to the second opening, the color resist unit is provided corresponding to the seventh opening, and an area of the eighth opening is greater than or equal to that of the second opening.

3. The display panel according to claim 2, wherein an area of the sixth opening is larger than that of the eighth opening.

4. The display panel according to claim 1, wherein the touch control metal layer overlaps and contacts the second light-blocking layer.

5. The display panel according to claim 4, wherein the touch control metal layer comprises a plurality of metal meshes, the second light-blocking layer comprises a plurality of light-blocking meshes, and at least one of the light-blocking meshes has a same shape and size as that of at least one of the metal meshes.

6. The display panel according to claim 1, wherein an insulation layer is provided between the touch control metal layer and the second light-blocking layer.

7. The display panel according to claim 6, wherein the touch control metal layer comprises a plurality of metal meshes, the second light-blocking layer comprises a plurality of light-blocking meshes, and at least one of the light-blocking meshes has a same shape and size as that of at least one of the metal meshes.

8. The display panel according to claim 1, wherein the light-emitting device layer further comprises a common cathode, the common cathode comprises a cathode light-transmitting hole provided corresponding to the second opening.

9. The display panel according to claim 1, wherein the second light-blocking layer comprises at least one of a black conductive metal or a black metal oxide.

10. A display panel, comprising:
    a substrate;
    an array layer disposed on a side of the substrate, wherein the array layer comprises a plurality of drive circuit units and a photosensitive unit disposed between adjacent ones of the drive circuit units;
    a first light-blocking layer disposed on a side of the array layer away from the substrate, wherein the first light-blocking layer comprises a first opening and a second opening disposed corresponding to the photosensitive unit;
    a light-emitting device layer disposed on a side of the first light-blocking layer away from the substrate, wherein the light-emitting device layer comprises a light-emitting unit provided corresponding to the first opening, and the drive circuit unit is electrically connected to the light-emitting unit;
    a second light-blocking layer disposed on a side of the light-emitting device layer away from the substrate, wherein the second light-blocking layer comprises a third opening provided corresponding to the first opening and a fourth opening provided corresponding to the second opening, and an area of the fourth opening is lesser than that of the second opening;
    a touch control metal layer disposed on a side of the second light-blocking layer away from the substrate, wherein the touch control metal layer comprises a fifth opening disposed corresponding to the first opening and a sixth opening disposed corresponding to the second opening, and an area of the sixth opening is greater than or equal to that of the fourth opening,
    wherein the touch control metal layer comprises a plurality of metal meshes, the second light-blocking layer comprises a plurality of light-blocking meshes, and at least one of the light-blocking meshes has a same shape and a same size as that of at least one of the metal meshes.

11. The display panel according to claim 10, wherein at least one of the light-blocking meshes is disconnected at the fourth opening.

12. A display panel comprising:
    a substrate;
    an array layer disposed on a side of the substrate, wherein the array layer comprises a plurality of drive circuit units and a photosensitive unit disposed between adjacent ones of the drive circuit units;
    a pixel definition layer disposed on a side of the array layer away from the substrate, wherein the pixel definition layer comprises a first opening and a second opening disposed corresponding to the photosensitive unit and the pixel definition layer has a light absorbing property;
    a light-emitting device layer at least partially disposed on a side of the pixel definition layer away from the substrate, wherein the light-emitting device layer comprises a light-emitting unit provided in the first opening, and the light-emitting unit is electrically connected to a corresponding one of the drive circuit units;

a second light-blocking layer disposed on a side of the light-emitting device layer away from the substrate, wherein the second light-blocking layer comprises a third opening provided corresponding to the first opening and a fourth opening provided corresponding to the second opening, and an area of the fourth opening is lesser than that of the second opening; and a touch control metal layer disposed between the second light-blocking layer and the light-emitting device layer, wherein the touch control metal layer comprises a fifth opening disposed corresponding to the first opening and a sixth opening disposed corresponding to the second opening, and an area of the sixth opening is greater than or equal to that of the fourth opening.

13. The display panel according to claim 12, further comprising:

a color film layer disposed on a side of the second light-blocking layer away from the substrate, wherein the color film layer comprises: a third light blocking layer and a color resist unit, the third light blocking layer comprises a seventh opening provided corresponding to the first opening and an eighth opening provided corresponding to the second opening, the color resist unit is provided corresponding to the seventh opening, and an area of the eighth opening is greater than or equal to that of the second opening.

14. The display panel according to claim 13, wherein an area of the sixth opening is larger than that of the eighth opening.

15. The display panel according to claim 12, wherein the touch control metal layer overlaps and contacts the second light-blocking layer.

16. The display panel according to claim 15, wherein the touch control metal layer comprises a plurality of metal meshes, the second light-blocking layer comprises a plurality of light-blocking meshes, and at least one of the light-blocking meshes has a same shape and a same size as that of at least one of the metal meshes.

17. The display panel according to claim 12, wherein the touch control metal layer comprises a plurality of metal meshes, the second light-blocking layer comprises a plurality of light-blocking meshes, and at least one of the light-blocking meshes has a same shape and a same size as that of at least one of the metal meshes.

18. The display panel according to claim 17, wherein at least one of the light-blocking meshes is disconnected at the fourth opening.

19. The display panel according to claim 12, wherein the light-emitting device layer further comprises a common cathode, the common cathode comprises a cathode light-transmitting hole provided corresponding to the second opening.

20. The display panel according to claim 12, wherein the second light-blocking layer comprises at least one of a black conductive metal or a black metal oxide.

* * * * *